(12) United States Patent
Lee

(10) Patent No.: US 8,324,582 B2
(45) Date of Patent: Dec. 4, 2012

(54) DIRECT CONVERSION X-RAY IMAGING DEVICE WITH STRIP ELECTRODES

(76) Inventor: Denny L. Lee, West Chester, PA (US)

( * ) Notice: Subject to any disclaimer, the term of this patent is extended or adjusted under 35 U.S.C. 154(b) by 274 days.

(21) Appl. No.: 12/837,115

(22) Filed: Jul. 15, 2010

(65) Prior Publication Data
US 2011/0012022 A1    Jan. 20, 2011

Related U.S. Application Data

(60) Provisional application No. 61/226,139, filed on Jul. 16, 2009.

(51) Int. Cl.
*G01T 1/24* (2006.01)
(52) U.S. Cl. .............................. 250/370.08; 250/370.09
(58) Field of Classification Search ............. 250/370.08, 250/370.09
See application file for complete search history.

(56) References Cited

U.S. PATENT DOCUMENTS

| | | | |
|---|---|---|---|
| 5,262,649 A | 11/1993 | Antonuk et al. | |
| 5,319,206 A | 6/1994 | Lee et al. | |
| 5,563,421 A | 10/1996 | Lee et al. | |
| 6,171,643 B1 | 1/2001 | Polischuk et al. | |
| 7,233,005 B2 | 6/2007 | Bogdanovich et al. | |
| 7,256,402 B1 | 8/2007 | Lee | |
| 2004/0217294 A1* | 11/2004 | Zur | 250/370.09 |

* cited by examiner

*Primary Examiner* — Christine Sung
(74) *Attorney, Agent, or Firm* — Caesar, Rivise, Bernstein, Cohen & Pokotilow, Ltd.

(57) ABSTRACT

A flat panel X-ray imager using an amorphous selenium detector which uses a dielectric layer within the X-ray conversion layer to form an interface between the X-ray conversion layer and the high voltage bias electrode. To accomplish the removal of trapped counter charges at the dielectric/selenium layer, a plurality of discrete or strip electrodes are provided in contact with the dielectric layer and which are electrically coupled into distinct groups. During X-ray exposure, a high bias voltage is applied to all groups of strip electrodes. Following X-ray exposure and image readout, the groups of strip electrodes are energized using a plurality of differently-phased energization signals to drive trapped counter charges toward "gutter" strip electrodes at the sides of the detector. A second embodiment of the flat panel X-ray imager includes sandwiching the discrete electrodes in a dielectric layer applied against the selenium layer and including a continuous electrode on the opposite side of the dielectric layer. Application of a high voltage bias to the continuous electrode results in an electric field in the selenium layer that is smoothed during X-ray acquisition. Discrete electrode energization to drive trapped counter charges to the gutter electrodes occurs while the high voltage bias is present.

38 Claims, 14 Drawing Sheets

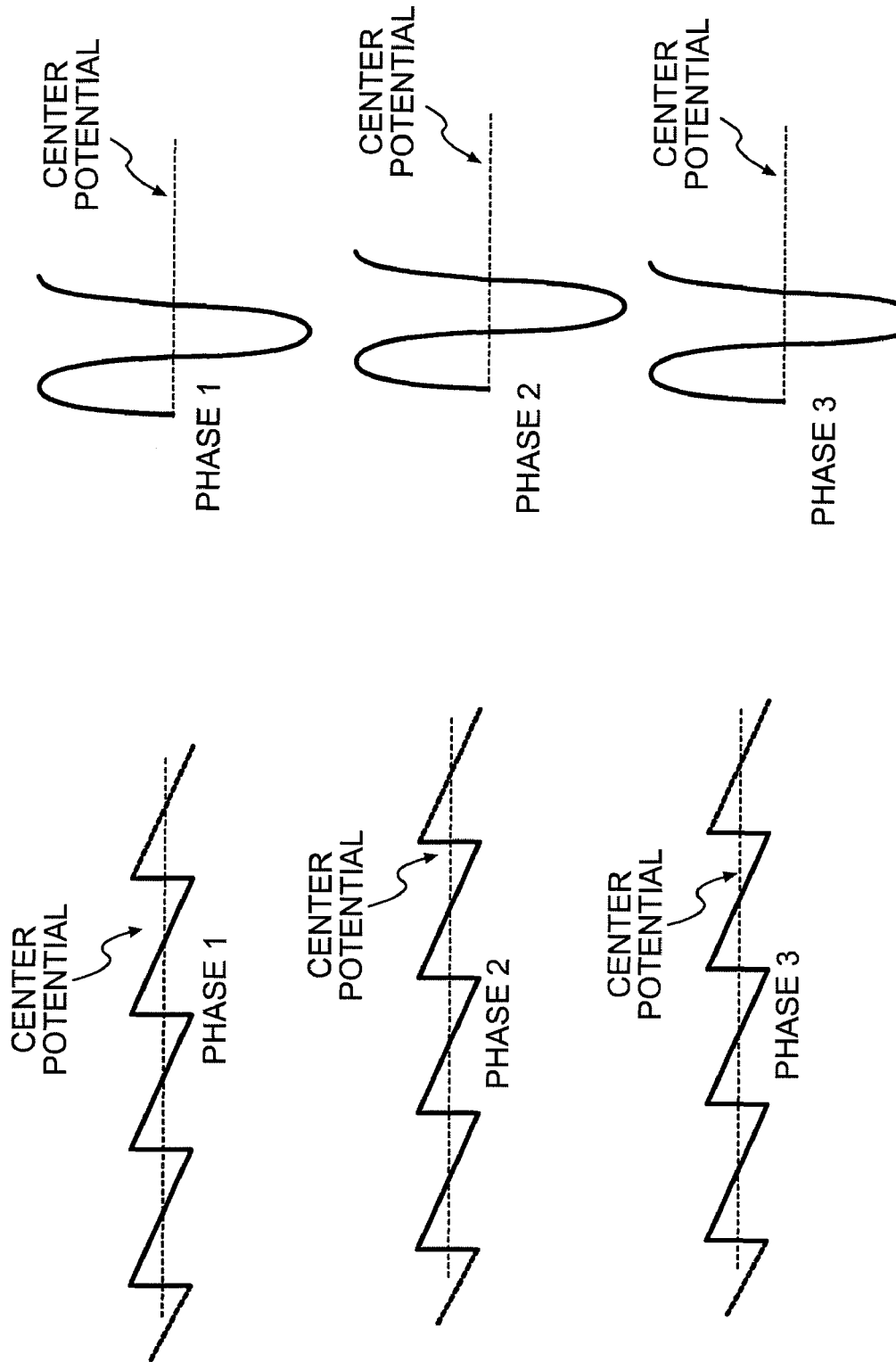

DIRECT CONVERSION X-RAY IMAGING DEVICE WITH STRIP ELECTRODES

CROSS-REFERENCE TO RELATED APPLICATIONS

This application claims priority under 35 U.S.C. §119(e) of U.S. Provisional Application Ser. No. 61/226,139, filed on Jul. 16, 2009, entitled DIRECT CONVERSION X-RAY IMAGING DEVICE WITH STRIP ELECTRODES, and whose entire disclosure is incorporated by reference herein.

BACKGROUND OF THE INVENTION

1. Field of Invention

The present invention pertains to an image capture panel for capturing direct radiographic images. More particularly, the present invention pertains to a new and novel method and apparatus for removing the trapped counter charges at the interface between an imager dielectric layer and the photoconducting layer.

2. Description of Related Art

Digital X-ray radiogram can be produced by using layers of radiation sensitive materials to capture incident X-ray as image-wise modulated patterns of light intensity (photons) or as electrical charges. Depending on the intensity of the incident X-ray radiation, electrical charges generated either electrically or optically by the X-ray radiation within a pixel area are quantized using a regularly arranged array of discrete solid state radiation sensors. U.S. Pat. No. 5,319,206 (Lee, et al.) and assigned to E. I. du Pont de Nemours and Company, describes a system employing a layer of photoconductive material to create an image-wise modulated areal distribution of electron-hole pairs which are subsequently converted to corresponding analog pixel (picture element) values by electro-sensitive devices, such as thin-film transistors. U.S. Pat. No. 5,262,649 (Antonuk et al.) describes a system employing a layer of phosphor or scintillation material to create an image-wise modulated distribution of photons which are subsequently converted to a corresponding image-wise modulated distribution of electrical charges by photosensitive devices, such as two dimensional amorphous silicon photodiodes. These solid state systems have the advantage of being useful for repeated exposures to X-ray radiation without consumption and chemical processing of silver halide films.

In Indirect Conversion systems (e.g. U.S. Pat. No. 5,262,649) that utilize a scintillation material to create an image-wise modulated distribution of photons from the absorbed X-ray energy, photons generated from the absorbed X-ray may undergo multiple scattering or spreading before they are detected by the two dimensional photosensitive device, resulting with degradation of image sharpness or a lower MTF (Modulation Transfer Function). The degradation of image sharpness is significant especially for thicker layer of scintillation material is required to capture sufficient x-ray quanta for image forming.

In Direct Conversion systems (FIG. 1) utilizing a photoconductive material, such as selenium described in U.S. Pat. No. 5,319,206, before exposure to image-wise modulated X-ray radiation, an electrical potential is applied to the top electrode 100 to provide an appropriate electric field. During exposure to X-ray radiation 111, electron-hole pairs (indicated as − and +) are generated in the photoconductive layer 104 (referred to in FIG. 1 as "X-ray Semiconductor") in response to the intensity of the image-wise modulated pattern of X-ray radiation, and these electron-hole pairs are separated by the applied biasing electric field supplied by a high voltage power supply 120 (e.g., programmable). The electron-hole pairs move in opposite directions along the electric field lines toward opposing surfaces of the photoconductive layer 104 (also referred to as an X-ray semiconductor). After the X-ray radiation exposure, a charge image is stored in the storage capacitor 112 of the TFT array 112A. This image charge is then readout by an orthogonal array of thin film transistors 110 and charge integrating amplifiers 118. In Direct Conversion systems, since the electric field is perpendicular to the charge collection electrode 106, the image sharpness or MTF is preserved regardless of the thickness of the photoconductive material. Thicker X-ray conversion material can be used to absorb sufficient X-ray energy without compromising the resulted image quality. As also shown in FIG. 1, the device includes a dielectric layer 102, an electron blocking layer 108 and a glass substrate 122.

In Direct Conversion systems, the bias voltage is applied between an upper electrode 100 and the ground plane connected to the charge collection electrodes 106. In one design, this upper electrode 100 can be insulated from the photoconductive material 104 by a thin layer of dielectric material 102, such as the system described in U.S. Pat. No. 5,319,206, no charge can be injected from the high voltage bias electrode to the selenium layer. In another design, the upper electrode can also be connected to the photoconductive material via a non-insulated charge blocking layer such as U.S. Pat. No. 7,233,005 (Bogdanovich, et al.) or via a highly doped N-type or P-type semiconducting non-insulated layer structure, such as U.S. Pat. No. 6,171,643 (Polischuk, et al.), to serve as a charge blocking layer. For systems using non-insulating layer, a certain amount of leakage current is always present. Furthermore, after X-ray exposure, charges accumulated at the upper interface eventually need to pass through or break through this layer and return to the power supply. The current that passes through or break through this charge blocking layer will gradually weaken the charge blocking and the leakage current will increase in time especially in areas of high radiation exposure. With the design where the upper electrode 100 is totally insulated from the photoconductive layer 104 by dielectric material 102, no current is allowed to pass through or break through and therefore the charge injection blocking can be maintained. However, the accumulated charges in the dielectric-photoconductive layer need to be removed or returned to ground after the X-ray exposure. Methods to remove these trapped charges have been described such as that described in U.S. Pat. No. 5,563,421 (Lee, et al.).

All references cited herein are incorporated herein by reference in their entireties.

BRIEF SUMMARY OF THE INVENTION

A flat panel X-ray imager is disclosed and which comprises: a plurality of discrete (e.g., strip, etc.) electrodes in contact with a dielectric layer which in turn is in contact with a photoconducting layer (e.g., amorphous selenium) for converting X-ray energy to electron-hole pairs, a thin film transistor layer coupled between charge collection electrodes, disposed within the photoconducting layer, and a charge amplifier, and further including storage capacitors coupled between the charge collection electrodes and a ground; and wherein the storage capacitors are coupled to the thin film transistor layer; a power supply coupled between the plurality of discrete electrodes and the ground, and wherein the power supply generates an electric field between the plurality of strip electrodes and the charge collection electrodes during an X-ray exposure and an image readout; and wherein the plurality of discrete electrodes are driven at respective voltages, following the X-ray exposure and image readout, so as to drive out trapped counter charges between the dielectric layer and the photoconducting layer back to the power supply.

A method of returning trapped counter charges in a flat panel X-ray imager comprising a dielectric layer, a photoconducting layer (e.g., amorphous selenium) for converting X-ray energy to electron-hole pairs, a thin film transistor layer coupled between charge collection electrodes, disposed within the photoconducting layer, and a ground is disclosed. The method comprises: positioning a plurality of discrete (e.g., strip, etc.) electrodes in contact with the dielectric layer which is in contact with the photoconducting layer; simultaneously energizing all of the discrete electrodes from a power supply, coupled between the discrete electrodes and the ground, during X-ray exposure and image readout which causes trapped counter charges to appear at an interface between the dielectric layer and the photoconducting layer; and energizing respective groupings of discrete electrodes with respective energization signals to drive out the trapped counter charges towards gutter discrete electrodes positioned at edges of the interface which returns the trapped counter charges to the power supply.

A flat panel X-ray imager is disclosed and which comprises: a plurality of discrete (e.g., strip, etc.) electrodes disposed within a dielectric layer (or positioned between respective dielectric layers, etc.) which in turn is in contact, on a first side of the dielectric layer, with a photoconducting layer (e.g., amorphous selenium) for converting X-ray energy to electron-hole pairs, a thin film transistor layer coupled between charge collection electrodes, disposed within the photoconducting layer, and a charge amplifier, wherein storage capacitors are coupled between the charge collection electrodes and a ground, wherein the storage capacitors are coupled to the thin film transistor layer; a continuous electrode positioned against a second side, opposite the first side, of the dielectric layer; a high voltage bias source coupled between the continuous electrode, including the discrete electrodes, and the ground, and wherein the high voltage bias source generates an electric field between the continuous electrode and the charge collection electrodes during an X-ray exposure and an image readout; and wherein the plurality of discrete electrodes are driven at respective voltages, following the X-ray exposure and image readout, so as to drive out trapped counter charges between the dielectric layer and the photoconducting layer back to the high voltage bias source.

A method of returning trapped counter charges in a flat panel X-ray imager is disclosed comprising a continuous electrode, a dielectric layer, a photoconducting layer for converting X-ray energy to electron-hole pairs, a thin film transistor layer coupled between charge collection electrodes, disposed within said photoconducting layer, and a ground is disclosed. The method comprises: positioning a continuous electrode against a first side of the dielectric layer; embedding a plurality of discrete electrodes within the dielectric layer which is in contact with the photoconducting layer on a second side, opposite of the first side, of the dielectric layer; coupling a high voltage bias source between the continuous electrode, including the discrete electrodes, and ground for achieving X-ray capture and image readout which also causes trapped counter charges to appear at an interface between the second side of the dielectric layer; energizing respective groupings of the discrete electrodes with respective energization signals to drive out the trapped counter charges towards gutter discrete electrodes positioned at edges of the interface which return the trapped counter charges to the high voltage bias source.

BRIEF DESCRIPTION OF SEVERAL VIEWS OF THE DRAWINGS

The invention will be described in conjunction with the following drawings in which like reference numerals designate like elements and wherein:

FIG. 11B depicts an alternative trapped counter charge drive saw-tooth wave signal for use with the second embodiment; and FIG. 11C depicts an alternative trapped counter charge drive sinusoidal wave signal for use with the second embodiment.

DETAILED DESCRIPTION OF THE INVENTION

Figure 1:
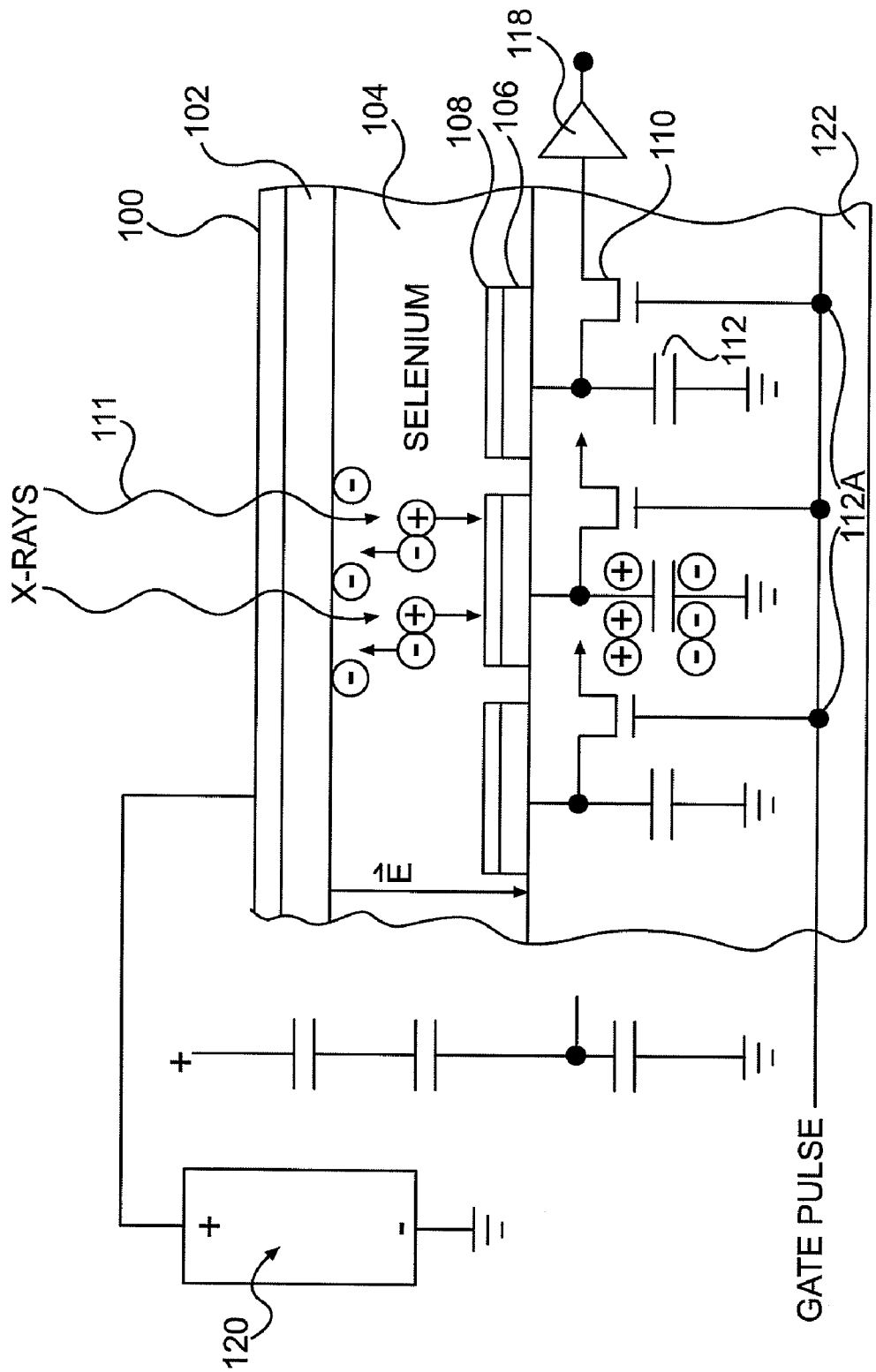
FIG. 1 shows the prior art.

As mentioned previously, FIG. 1 shows the prior art of a Direct Conversion X-ray imaging device having a upper bias electrode 100, a dielectric layer 102, a selenium layer 104 for converting X-ray energy to electrical charges, and the imaging forming Thin Film Transistor (TFT) 110 two dimensional imaging forming element. In contrast, the present invention 20 (FIG. 2) provides a new and novel way of removing the trapped counter charges at the dielectric 102-photoconductive layer 104 interface.

Figure 2:
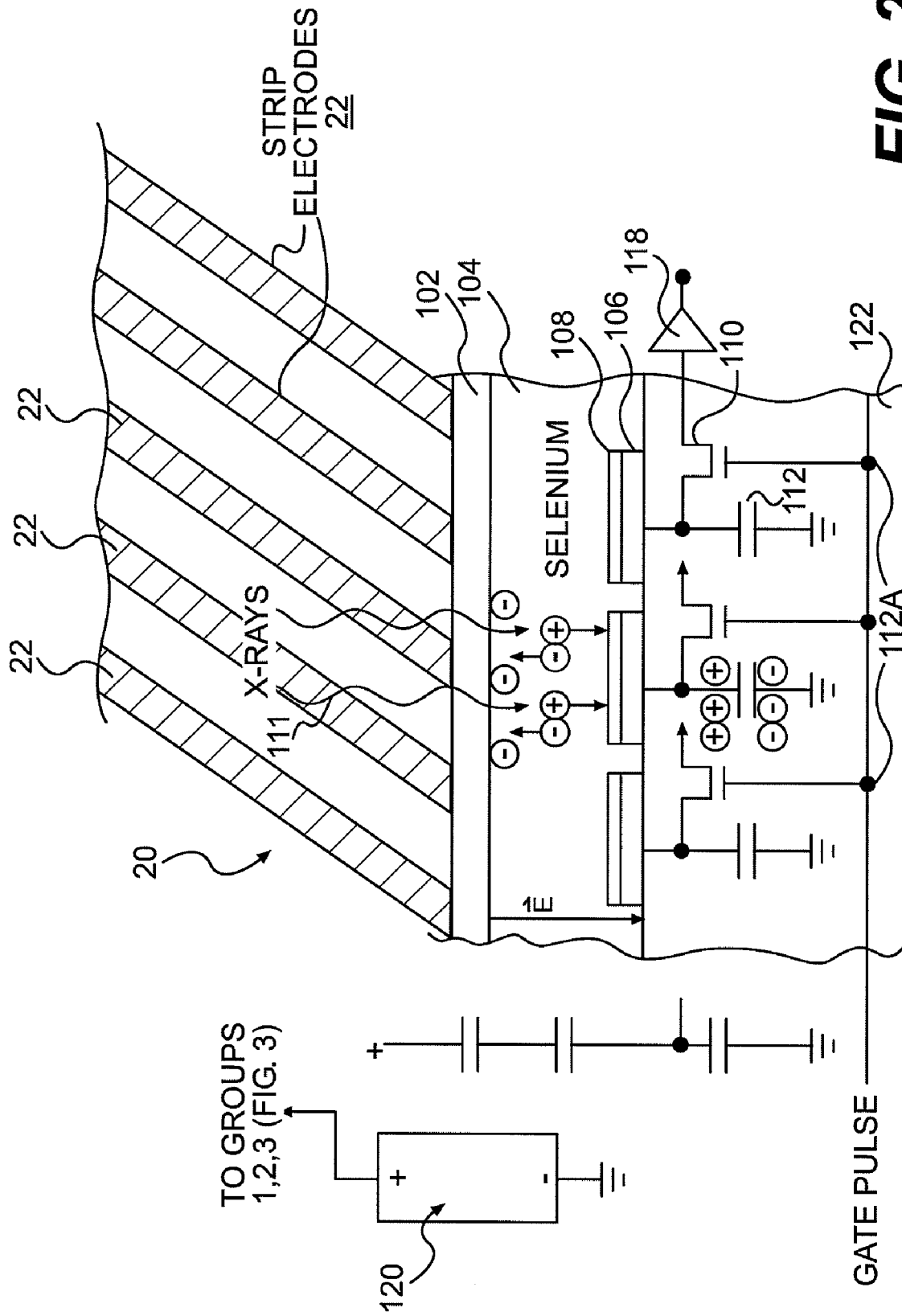
FIG. 2 shows the present invention detector with discrete or strip electrodes.
Figure 3:
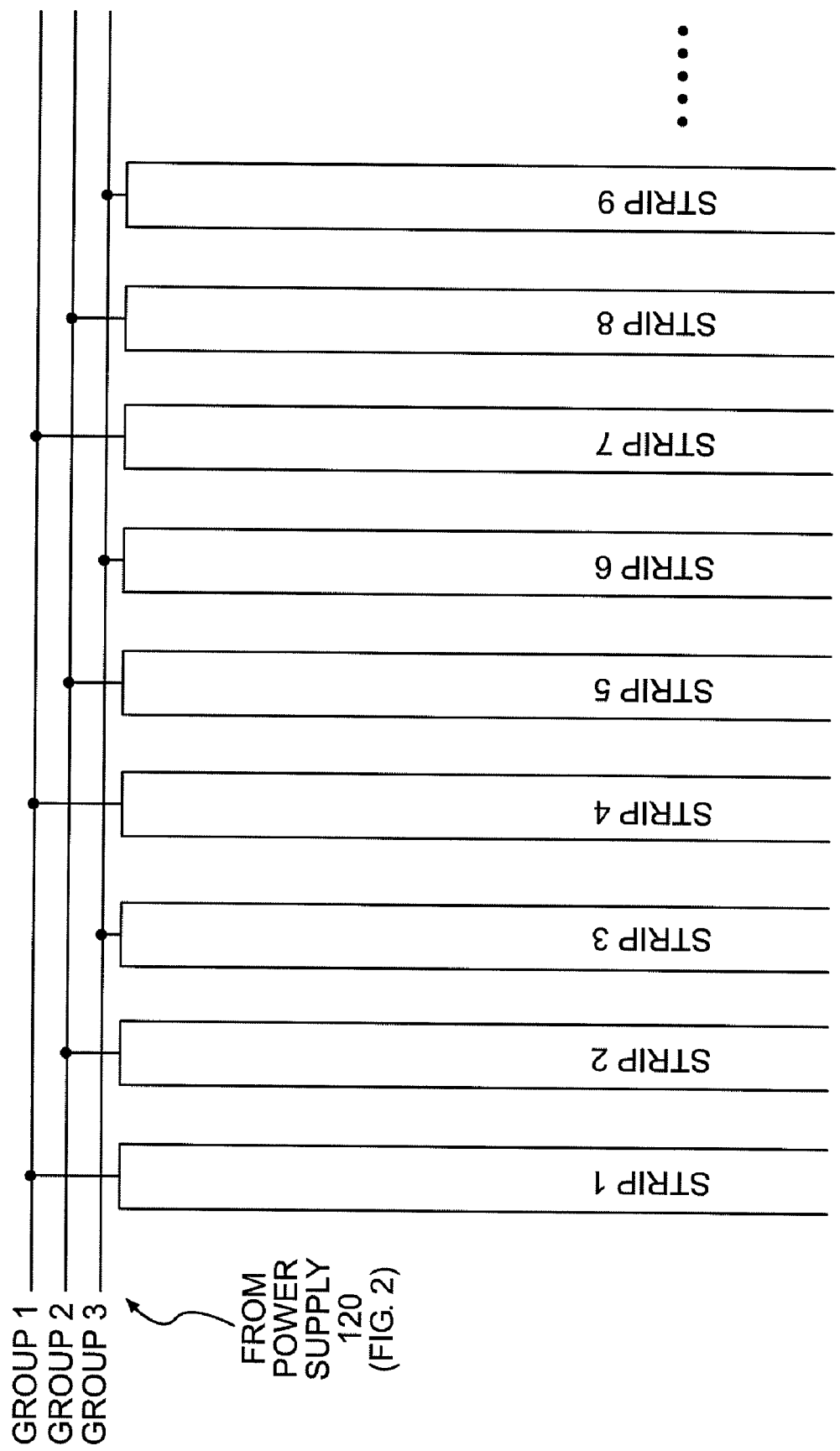
FIG. 3 shows the electrical connection of the strips electrodes.
Figure 4:
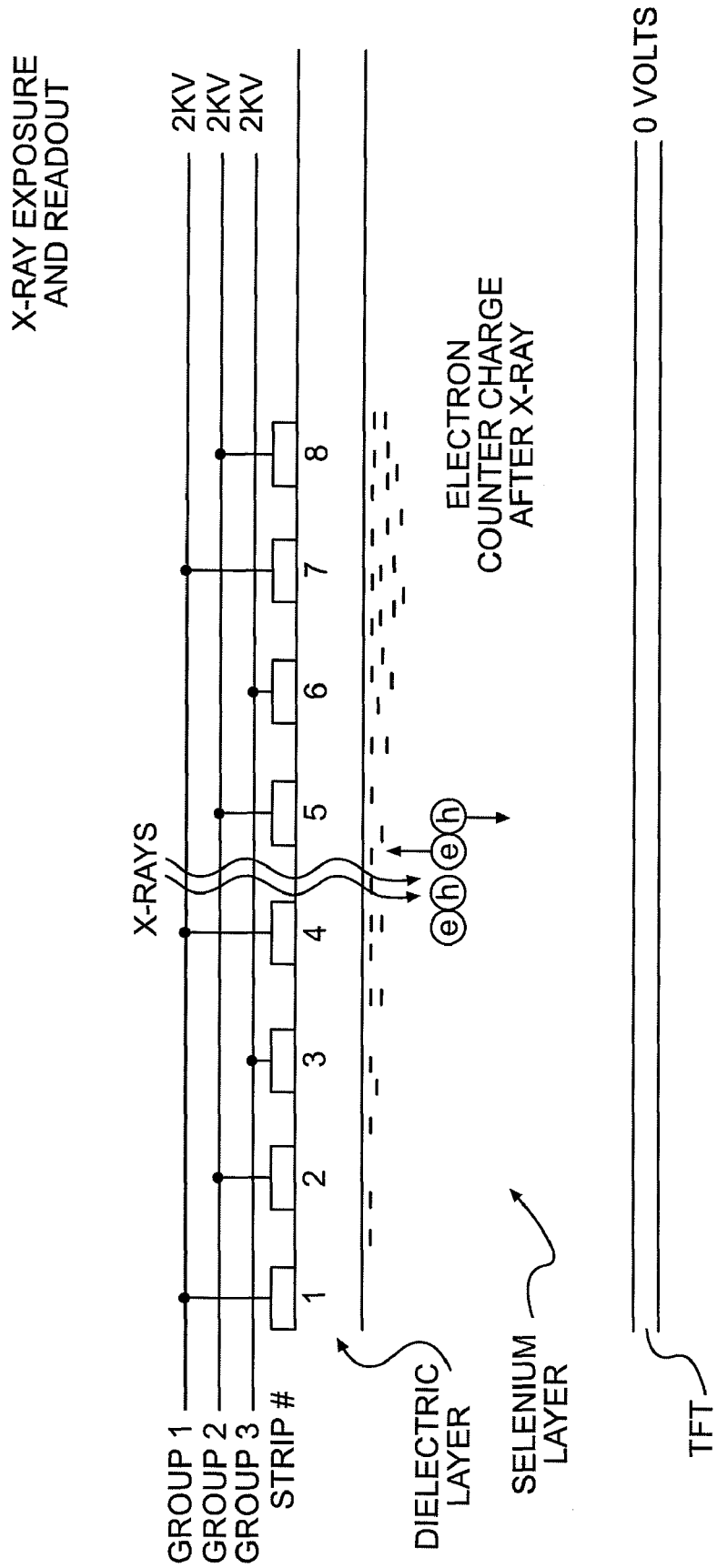
FIG. 4 shows the strip potential during X-ray and readout phase.
Figure 5:
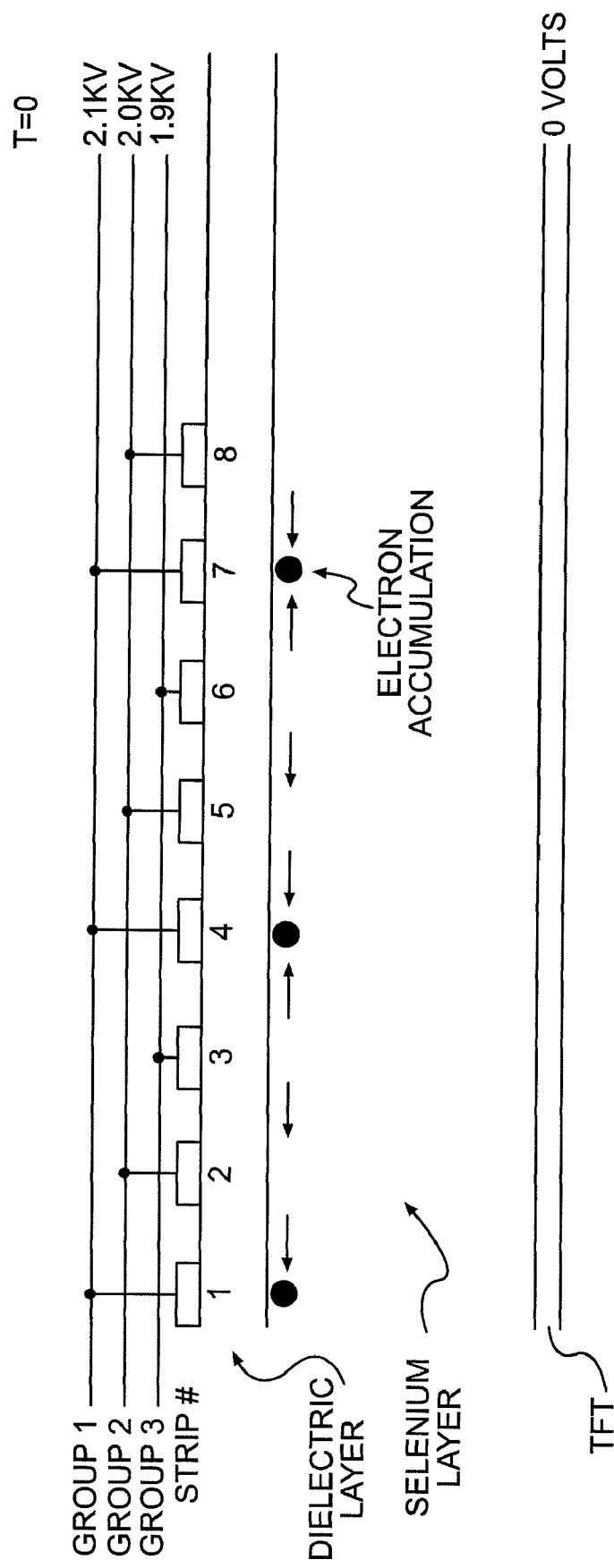
FIG. 5 shows the strip potential at the start of interface charge removal (T=0), and the electron accumulation points.
Figure 6:
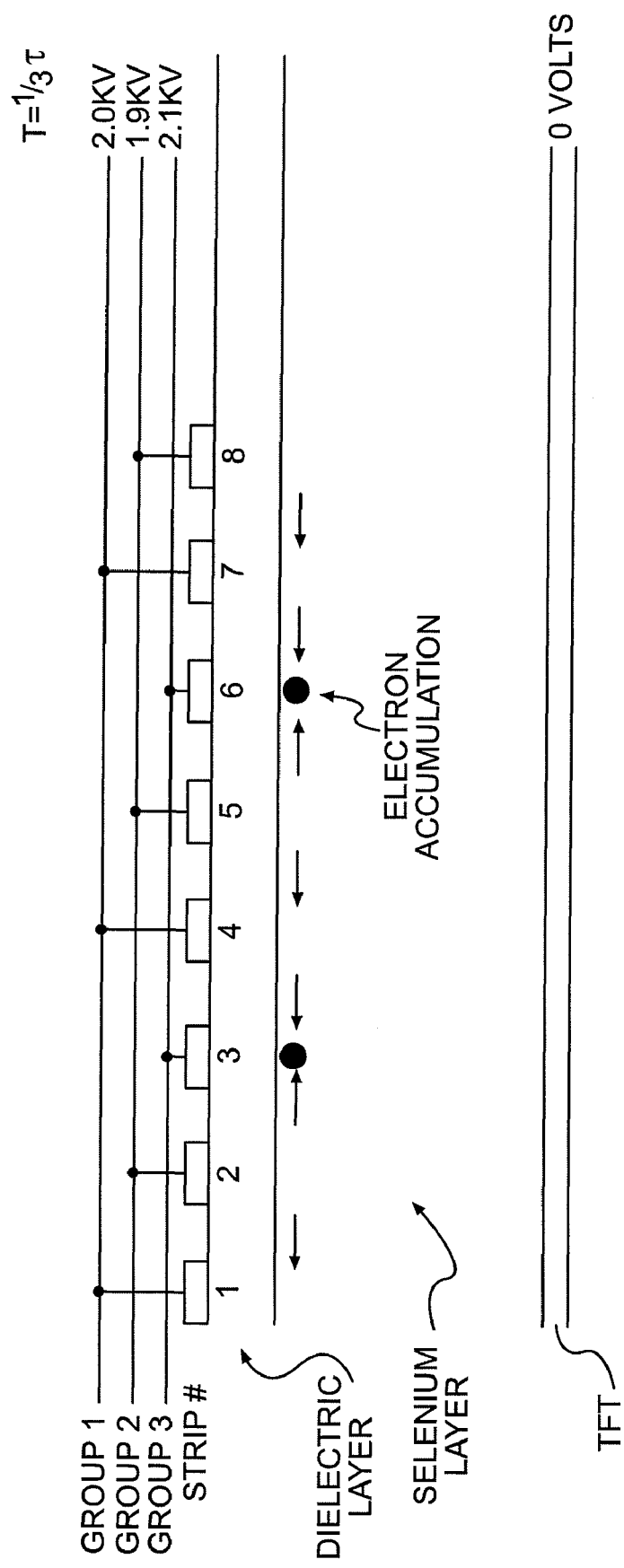
FIG. 6 shows the strip potential after ⅓ period (τ) of the saw-tooth-wave potential and the new electron accumulation points.
Figure 7:
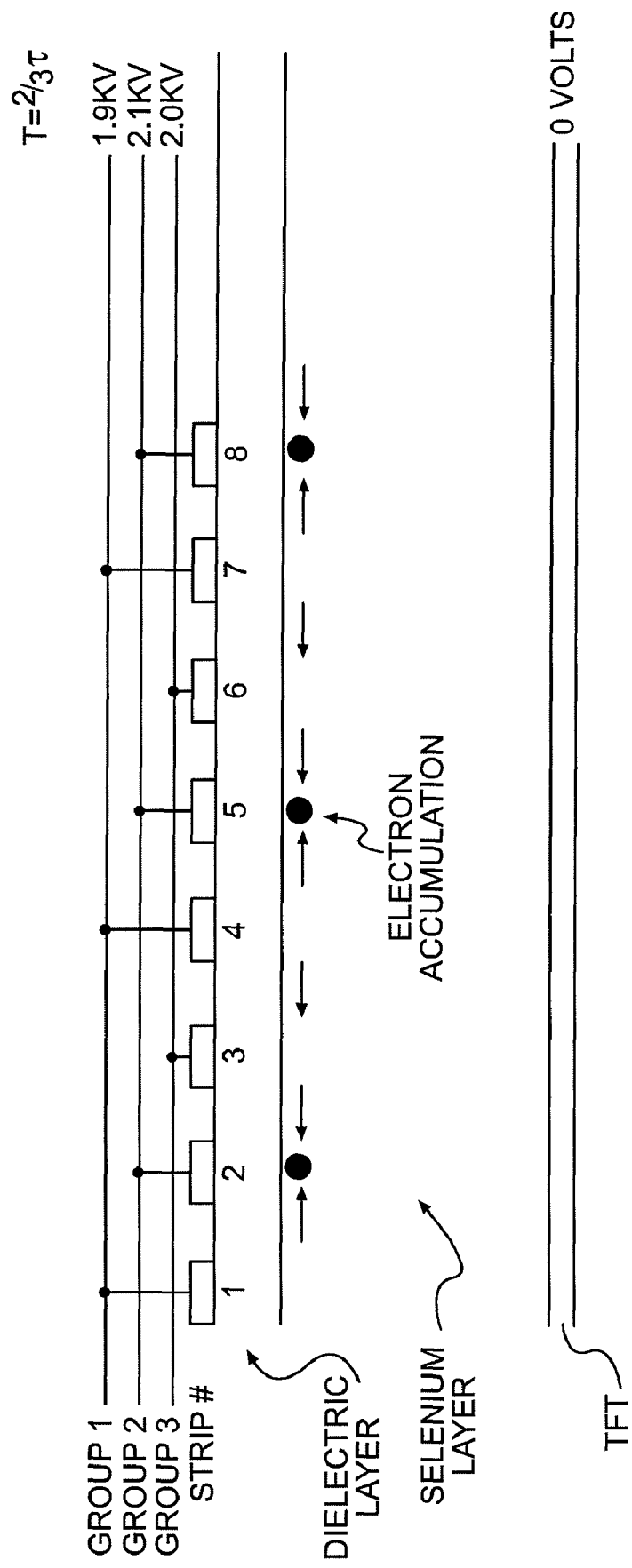
FIG. 7 shows the strip potential after ⅔ period (τ) and the new electron accumulation points.
Figure 8:
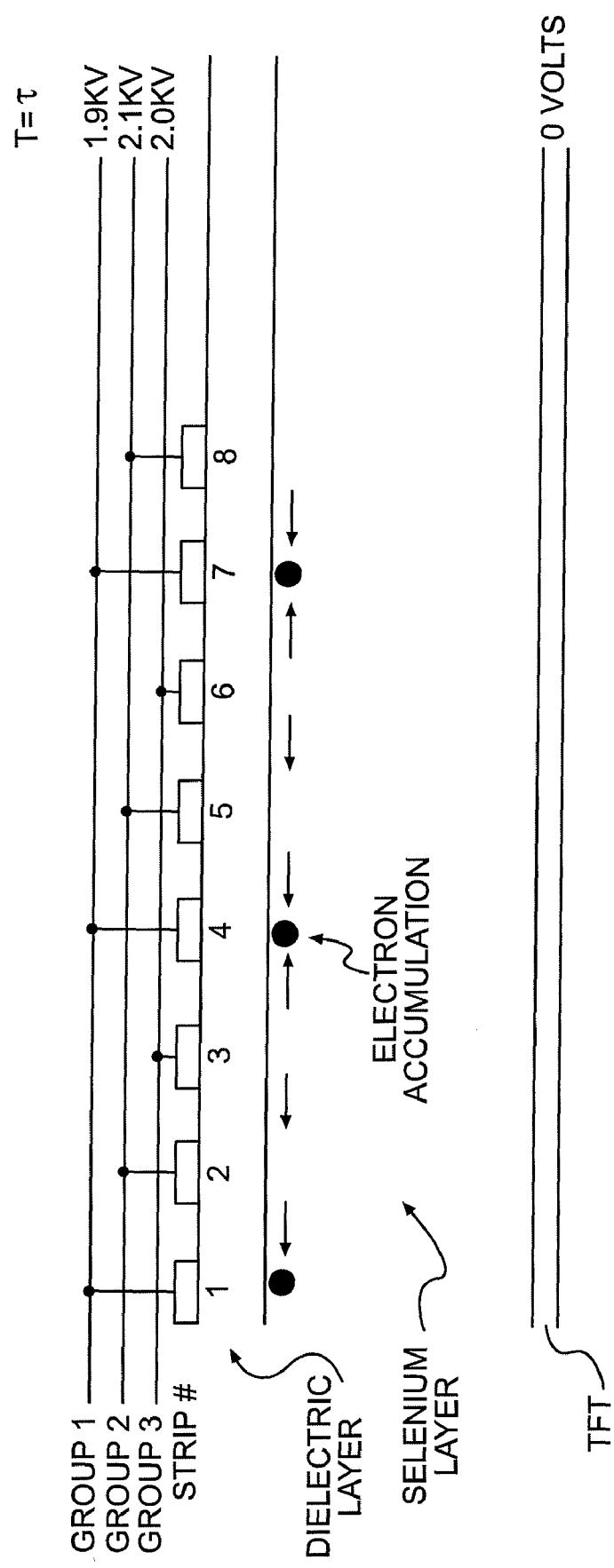
FIG. 8 shows the strip potential after one period and the new electron accumulation points. At this time, the strip potential is the repeat of T=0. From these figures, it can be seen that the electron accumulation points continue to move to the left until they reach the 'Gutter Electrodes" located at the edge of the detector and at the interface between the dielectric layer and the selenium layer.
Figure 9:
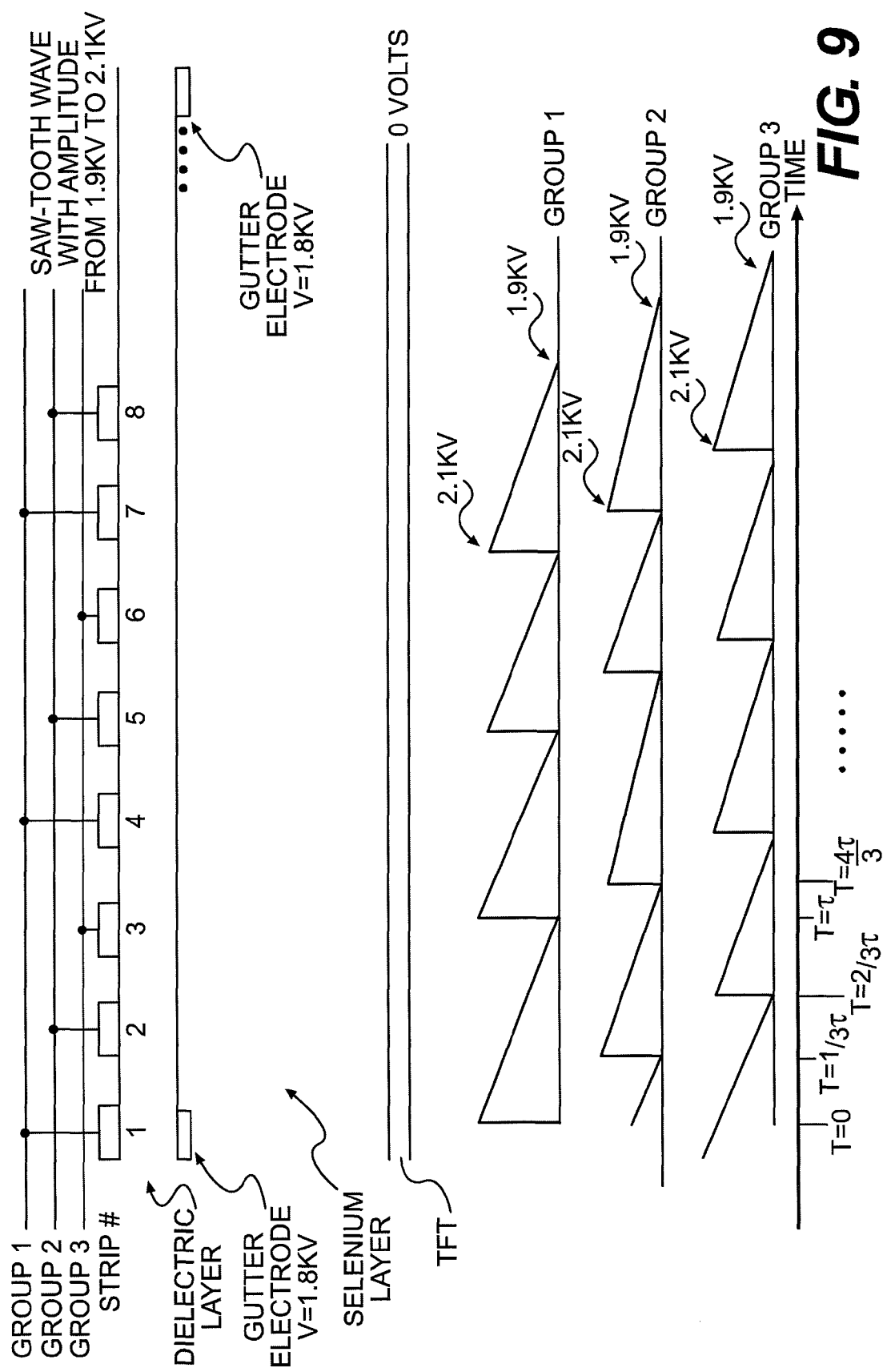
FIG. 9 shows the "Gutter Electrode," and the phase of the saw-tooth-wave at each group of strip electrode in time.

In particular, in this new invention 20, the high voltage bias planar electrode 100 is replaced by discrete or "strip" electrodes 22 covering the entire bias plane as shown in FIG. 2. The pitch of these strip electrodes 22 is proportional to the thickness of the dielectric layer 2 separating the plane of strip electrodes 22 to the selenium layer 104. The width of each strip 22 can be about half of the pitch or less. These strips 22 are connected electrically into three groups, as shown in FIG. 3. In group one, strip 1 is connected to strip 4, strip 7, strip 10 and so on (i.e., all the 3n+1 strips are connected together, where n is a sequential integer starting from zero). In group two, strip 2 is connected to strip 5, strip 8, strip 11, and so on (i.e., all the 3n+2 strips are connected together). In group three, strip 3 is connected to strip 6, strip 9, strip 12, and so on (i.e., all the 3n+3 strips are connected together). During the X-ray exposure phase of the operation, high bias voltage is applied to all three groups and therefore a potential plane is defined similar to the continuous planar bias electrode in the prior art. The electric field between these equal potential strips and the ground plane of the TFT acts the same way as the prior art and drives the X-ray generated image charges towards the charge collection electrode. After the X-ray exposure, image information is readout by the TFT array in the same way as the prior art. Upon the completion of the image readout, the three groups of strip electrodes are electrically separated. These three groups of strip electrodes are modulated by three periodic "saw-tooth-wave" signals of the same form, with group two 120 degree phase lagging behind group one and group three 240 degree phase lagging behind group one. FIGS. 5-8 depict the application of the respective saw-tooth energization signals at different times in the period, τ. Depending on the pitch of the strip and the amplitude of the saw-tooth-wave, a traveling lateral electrode field in the order of 1 to 80 volts per micron will propagate along the interface between the dielectric layer and the selenium layer. In the event that positive bias potential is used, at any given time when this modulated saw-tooth-wave potential is present in the upper strip electrodes, electrons at the interface (counter charge from the X-ray exposure) will be driven to the nearby strip with the highest potential. Because the potential of the strips are 120 degree out of phase, every ⅓ the period of the saw-tooth wave, the highest potential is shifted in one direction to the next strip. This propagating field generated from the saw-tooth-wave of the upper strip electrodes therefore moves the interface electrons until they reach the edge of the detector where a "gutter" strip electrode located at the dielectric-selenium interface will return the charges to the power supply. The electron charge movement in selenium with a typical electric field of 10 volts per micron is 360 cm/sec. It will take ⅒ seconds for the charges to move along the interface and to reach the gutter strip electrode for a detector with a width of 35 cm. The speed of the charge movement can be increased by a higher electric field, or by illuminating the upper surface with light so that photo-electrons are available for more current flow along the interface. During this phase of charge movement along the interface, the average bias voltage from the strip can be the same as the bias voltage during the X-ray and readout phase maintaining a more or less constant bias field. Since there is no bias reversal required in this novel way of charge removal, the field stability and detector stability in the selenium layer can be maintained.

It should be noted that the amplitudes of the sawtooth waves shown in the figures are by way of example only and thus, the range of 1.9 kV-2.1 kV is simply by way of example. In particular, in this example, the high voltage bias is assumed to be 2 kV and the amplitude of the sawtooth wave varies ±100V around the average voltage. Depending upon the thickness of the selenium layer 104 and the spacing of the strip electrodes 22, the average bias voltage can be several hundred volts to 10 kV. The amplitude of the sawtooth wave can then be from a few volts to 1 kV. (When the bias is at 10 kV, the sawtooth can be between 9 kV and 11 kV).

Figure 10A:
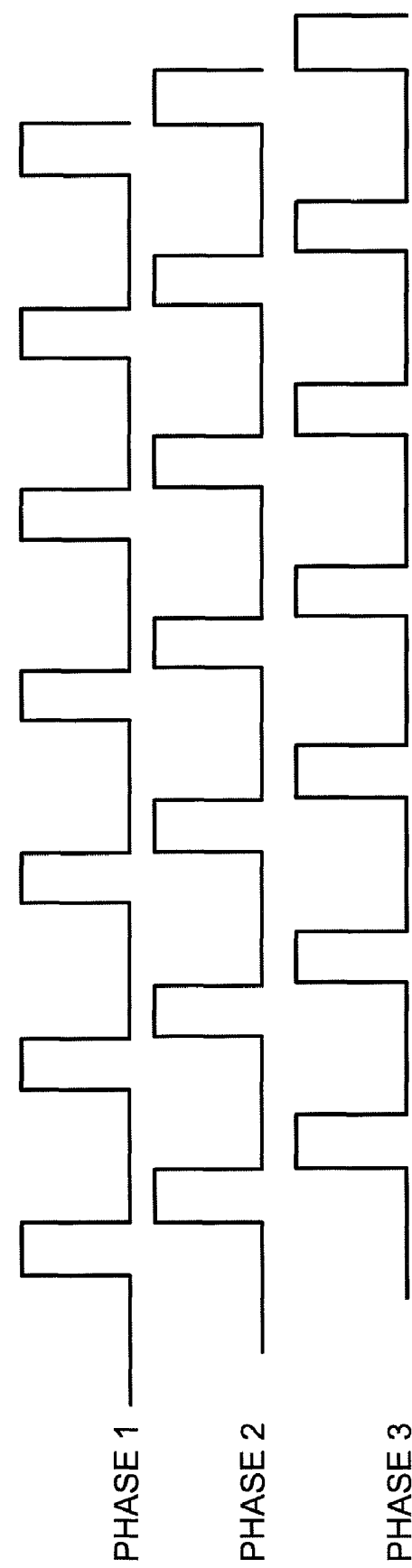
FIG. 10A depicts an alternative trapped counter charge drive square wave signal.
Figure 10B:
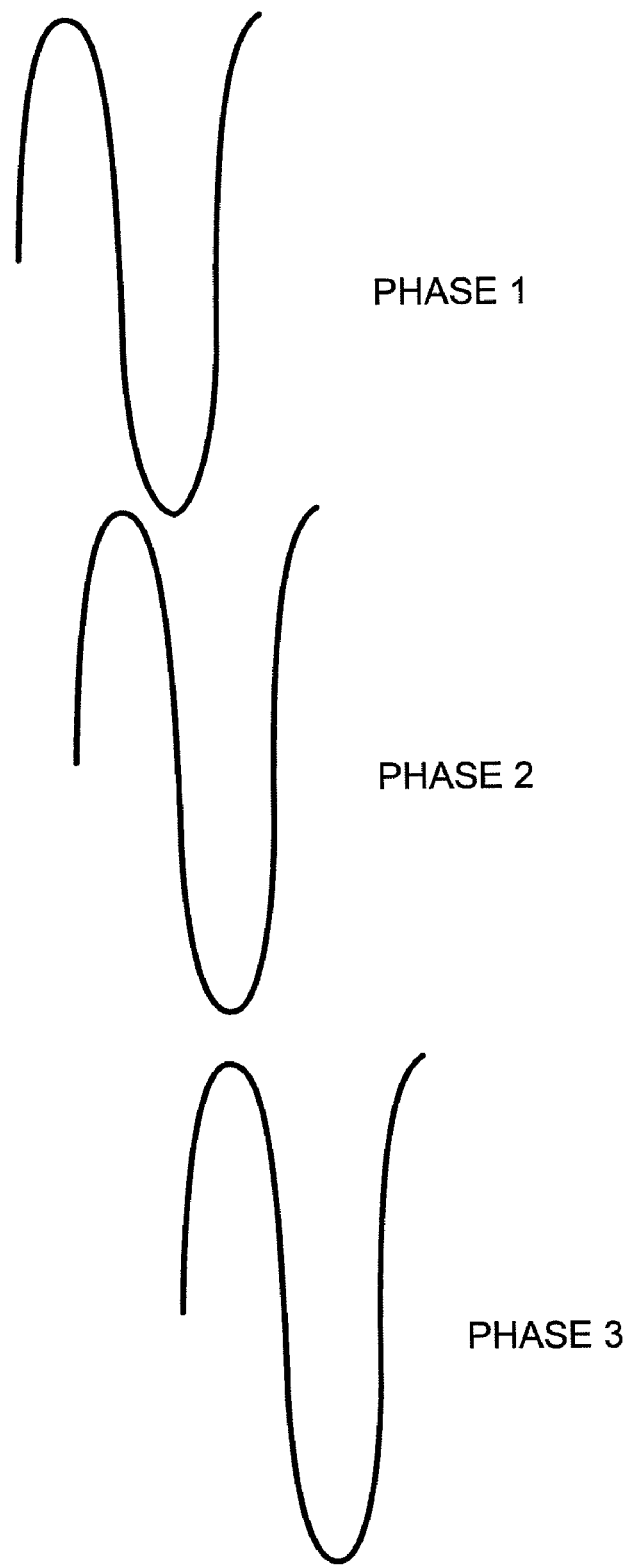
FIG. 10B depicts and alternative trapped counter charge drive sinusoidal wave signal.

It should also be understood that the sawtooth voltage is shown by way of example only. For example, square waves (e.g., three phase square waves, see FIG. 10A), or sinusoidal waves (e.g., three phase sinusoidal waves, see FIG. 10B), can also be used to drive the trapped counter charges to the gutter strip electrodes. As discussed previously with the sawtooth waves, each of the square waves, or the sinusoidal waves, is of a different phase (e.g., a different predetermined phase). Thus, it is within the broadest scope of the present invention to including any signal for driving the trapped counter charges to the gutter strip electrodes from the group consisting of sawtooth, square and sinusoidal waves.

Figure 11:
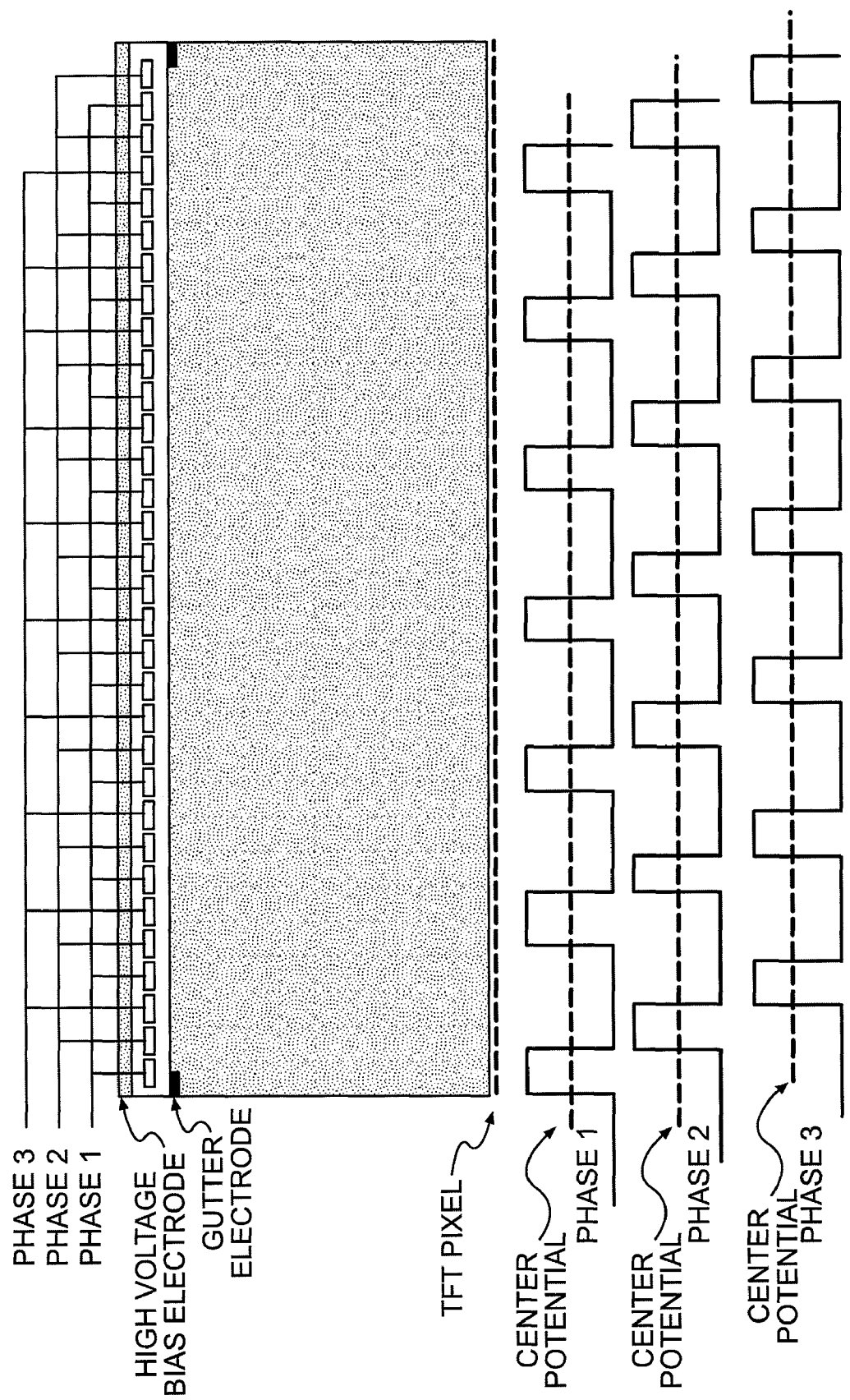
FIG. 11 depicts a second embodiment of the present invention that uses a high voltage bias electrode and using an exemplary square wave for driving the trapped counter charges.
Figure 11A:
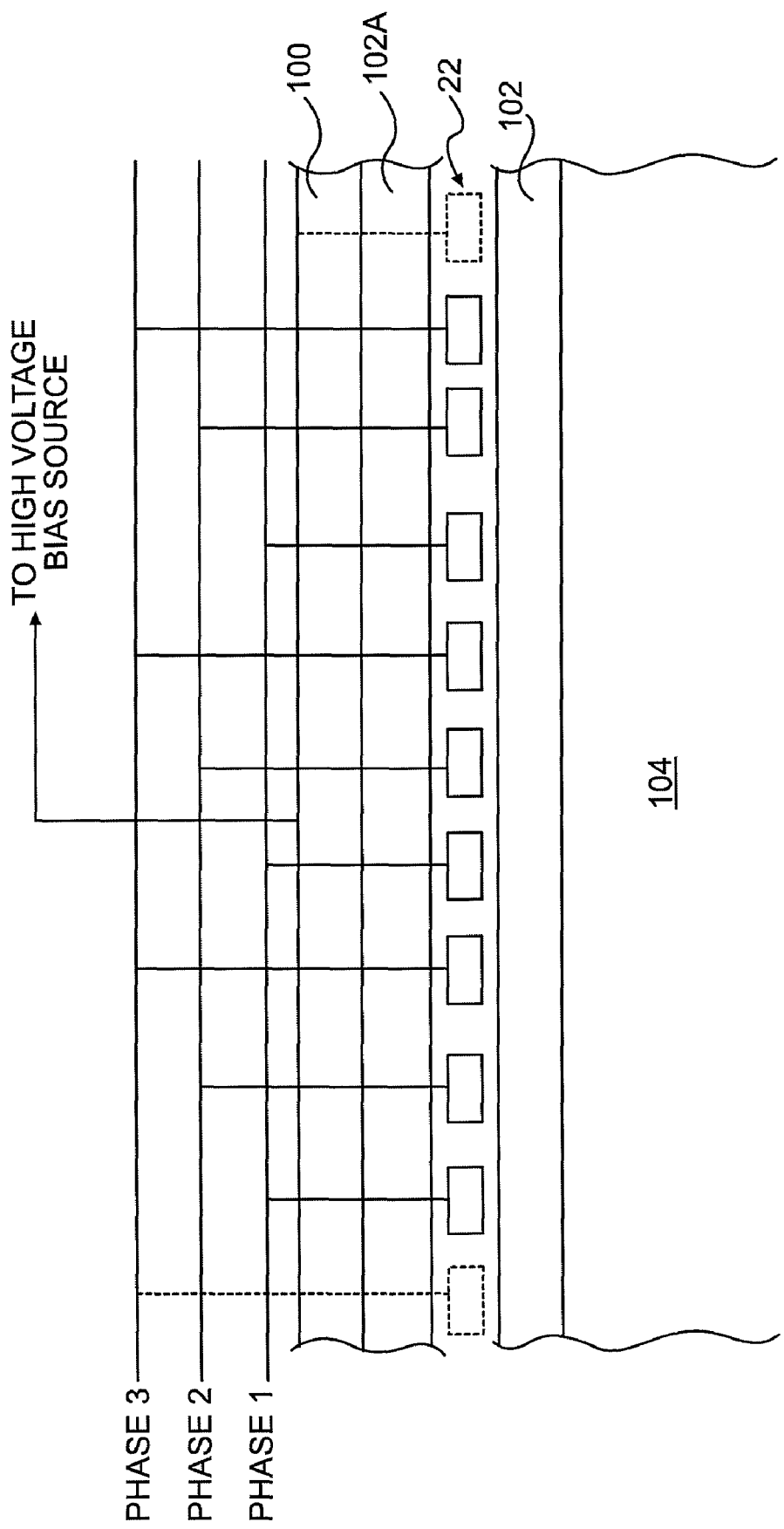
FIG. 11A depicts the upper portion of the detector of FIG. 11.

FIG. 11 depicts a second embodiment of the present invention wherein a high voltage bias electrode is included in the detector above the discrete or strip electrodes 22. This top high voltage electrodes makes the electric field in the selenium layer 104 "smooth" during X-ray acquisition. In particular, as shown most clearly in FIG. 11A, another thin dielectric layer 102A is positioned on top of the discrete or strip electrodes 22 and then the continuous high voltage plane electrode 100 is positioned on top thereof. By implementing such a configuration, it has been determined that the electric field in the selenium layer 104 during X-ray acquisition is not disturbed by the spacing of the strip electrodes 22. With the continuous high voltage plane electrode 100 and the strip electrodes 22 sandwiched between the two dielectric layers 102A and 102 (or alternatively, embedded within a single dielectric layer that surrounds the strip electrodes 22, as shown in FIG. 11), the applied high voltage bias produces an electrical potential distribution according to the thinness of the dielectric layer 102A/102, the thinness of the selenium layer 104, the dielectric constant of the dielectric material 102A/102 and the dielectric constant of selenium. With the strip electrodes 22 "buried" inside the dielectric layer 102A/102 and slightly below the continuous high voltage plane electrode 100, there is present at the position of the strip electrodes 22 (almost as if the strip electrodes 22 are absent) an electrical potential. As a result, during the X-ray acquisition phase, all of the strip electrodes 22 are biased with a certain voltage. If this voltage is the same as the "natural" potential at the position, these strip electrodes 22 will be "transparent" to the electric field, i.e., the strip electrodes 22 will not change the field between the continuous high voltage plane electrode 100 and the selenium layer 104. The selenium layer 104 then experiences a smooth distribution of uniform electric field (as if the strip electrodes 22, including the spacing or gaps therebetween, are not there). This ensures the uniformity of the X-ray image. After the X-ray image is read out, the trapped counter charge drive signals, (e.g., the three phase waves) are then applied to the strip electrodes 22 accordingly to remove the interfacial trapped charges to the gutter electrodes, as described previously. A center potential of the three phase waves (viz., the DC bias value of the three phase waves) is the same as the "natural potential, i.e., the previous "natural potential" is modulated by the three phase wave voltages. By way of example only, FIG. 11 shows the trapped counter charge drive signals as square waves, with the square waves operating around a center potential imposed the by the continuous high voltage plane electrode 100. Alternatively, the trapped counter charge drive signals can be the saw-tooth characteristics (FIG. 11B) or the sinusoidal characteristics (FIG. 11C). Thus, also by way of example only, if a 3 kV high voltage bias signal is imposed at the electrode 100, the trapped counter charge drive signals may operate around a 2.85 kV bias or center potential.

Although not shown in FIG. 11, the power to the different phases is also supplied from the high voltage power supply 120 as shown in FIG. 2 via a voltage divider, for example. The continuous high voltage plane electrode 100 is coupled to the high voltage power supply 120.

It should be further noted that the depiction (FIG. 11A) of the discrete electrodes 22 as being sandwiched between dielectric layers 102A and 102 covers all configurations of associating the discrete or strip electrodes with a dielectric layer. In other words, the second embodiment may comprise a "sandwich" configuration between two distinct dielectric layers 102A and 102. In addition, the second embodiment encompasses the discrete electrodes 22 as being embedded within a single dielectric layer as shown in FIG. 11. The key is that the discrete or strip electrodes 22 are not in electrical contact with the high voltage plane electrode 100 nor the selenium layer 104. As a result, the phrase "embedding the discrete or strip electrodes 22 within a dielectric layer" encompasses the configuration where the electrodes 22 are sandwiched between two distinct dielectric layers.

Moreover, it should be understood that the use of three differently-phased signals, whether they are saw-tooth, square or sinusoid signals, (as shown in FIGS. 9, 10A, 10B, 11, and 11B-11C) for driving the trapped counter charges is also by way of example and that the invention is not limited to that number. For example, the present invention may include four differently-phased saw-tooth waves, or four differently-phased square waves, or four differently-phased sinusoid waves, or even a greater number of such waves or even only two differently-phased sawtooth, or square or sinusoid waves. Thus, it is within the broadest scope of the present invention to include two or more differently-phased signals for driving the trapped counter charges to the gutter strip electrodes.

While the invention has been described in detail and with reference to specific examples thereof, it will be apparent to one skilled in the art that various changes and modifications can be made therein without departing from the spirit and scope thereof.

What is claimed is:

1. A flat panel X-ray imager comprising:
a plurality of discrete electrodes in contact with a dielectric layer which in turn is in contact with a photoconducting layer for converting X-ray energy to electron-hole pairs, a thin film transistor layer coupled between charge collection electrodes, disposed within said photoconducting layer, and a charge amplifier, storage capacitors coupled between said charge collection electrodes and a ground, said storage capacitors being coupled to said thin film transistor layer;
a power supply coupled between said plurality of discrete electrodes and said ground, said power supply generating an electric field between said plurality of strip electrodes and said charge collection electrodes during an X-ray exposure and an image readout;
a plurality of gutter discrete electrodes positioned at edges of said dielectric-photoconducting layers for collecting said trapped counter charges and returning them to said power supply; and
wherein said plurality of discrete electrodes are driven at respective voltages, following said X-ray exposure and image readout, so as to drive out trapped counter charges between said dielectric layer and said photoconducting layer back to said power supply.

2. The flat panel X-ray imager of claim 1 wherein adjacent discrete electrodes are driven at different voltages to cause said counter charges to be driven to adjacent discrete electrodes with the highest potential.

3. The flat panel X-ray imager of claim 2 wherein said different voltages comprises signals from the signal group consisting of sawtooth, square and sinusoidal voltages and wherein each of said signals has a predetermined phase.

4. The flat panel X-ray imager of claim 3 wherein said plurality of discrete electrodes comprises a plurality of groupings of discrete electrodes wherein discrete electrodes in a respective group are driven with the same signal of the same predetermined phase and wherein no adjacent discrete electrode is in the same grouping.

5. The flat panel X-ray imager of claim 4 wherein each grouping of discrete electrodes comprises three discrete electrodes.

6. The flat panel X-ray imager of claim 5 wherein said groupings are energized by voltage signals from the signal group consisting of sawtooth, square and sinusoidal voltages and wherein the groupings voltage signals are 120° out of phase with each other.

7. The flat panel X-ray imager of claim 6 wherein each of said voltage signals comprises an amplitude of approximately 1.9 kV-2.1 kV where a high voltage bias of approximately 2 kV is used.

8. The flat panel X-ray imager of claim 1 wherein a pitch of each of said discrete electrodes is proportional to a thickness of said dielectric layer.

9. The flat panel X-ray imager of claim 8 wherein a thickness of each of said discrete electrodes may comprise half of said pitch or less.

10. A method of returning trapped counter charges in a flat panel X-ray imager comprising a dielectric layer, a photoconducting layer for converting X-ray energy to electron-hole pairs, a thin film transistor layer coupled between charge collection electrodes, disposed within said photoconducting layer, and a ground, said method comprising:
positioning a plurality of discrete electrodes in contact with said dielectric layer which is in contact with said photoconducting layer;
simultaneously energizing all of said discrete electrodes from a power supply, coupled between said discrete electrodes and said ground, during X-ray exposure and image readout which causes trapped counter charges to appear at an interface between said dielectric layer and said photoconducting layer; and
energizing respective groupings of discrete electrodes with respective energization signals to drive out said trapped counter charges towards gutter discrete electrodes positioned at edges of said interface which return said trapped counter charges to said power supply.

11. The method of claim 10 wherein said step of energizing respective groupings of discrete electrodes comprises moving said counter charges to adjacent discrete electrodes with the highest potential.

12. The method of claim 11 wherein said step of energizing respective groupings comprises applying respective drive voltage signals to said discrete electrodes such that no adjacent discrete electrode is energized with the same drive voltage signal.

13. The method of claim 12 wherein said drive voltage signals comprise a voltage signal from the signal group consisting of sawtooth, square and sinusoidal voltages and wherein each of said signals has a predetermined phase.

14. The method of claim 13 wherein each of said groupings comprises three discrete electrodes.

15. The method of claim 14 wherein said groupings are energized by voltage signals from the signal group consisting of sawtooth, square and sinusoidal voltages and wherein the groupings voltage signals are 120° out of phase with each other.

16. The method of claim 15 wherein each of said voltage signals comprises an amplitude of approximately 1.9 kV-2.1 kV where a high voltage bias of approximately 2 kV is used.

17. The method of claim 15 wherein each of said voltage signals comprises an amplitude of approximately 1.9 kV-2.1 kV where a high voltage bias of approximately 2 kV is used.

18. The method of claim 10 wherein said step of positioning a plurality of discrete electrodes comprises forming a pitch of each of said discrete electrodes that proportional to a thickness of said dielectric layer.

19. The method of claim 18 wherein said step of positioning a plurality of discrete electrodes comprises forming a thickness of each of said discrete electrodes that is half of said pitch or less.

20. The method of claim 18 wherein said step of embedding a plurality of discrete electrodes comprises forming a thickness of each of said discrete electrodes that is half of said pitch or less.

21. The method of claim 10 further comprising the step of applying a light against an upper layer of said imager to accelerate the movement of the trapped counter charges toward said gutter discrete electrodes.

22. A flat panel X-ray imager comprising:
a plurality of discrete electrodes disposed within a dielectric layer which in turn is in contact, on a first side of said dielectric layer, with a photoconducting layer for converting X-ray energy to electron-hole pairs, a thin film transistor layer coupled between charge collection electrodes, disposed within said photoconducting layer, and a charge amplifier, storage capacitors coupled between said charge collection electrodes and a ground, said storage capacitors being coupled to said thin film transistor layer;
a continuous electrode positioned against a second side, opposite said first side, of said dielectric layer;
a high voltage bias source coupled between said continuous electrode, including said discrete electrodes, and said ground, said high voltage bias source generating an electric field between said continuous electrode and said charge collection electrodes during an X-ray exposure and an image readout;
a plurality of gutter discrete electrodes positioned at edges of said dielectric-photoconducting layers for collecting said trapped counter charges and returning them to said high voltage bias source; and
wherein said plurality of discrete electrodes are driven at respective voltages, following said X-ray exposure and image readout, so as to drive out trapped counter charges between said dielectric layer and said photoconducting layer back to said high voltage bias source.

23. The flat panel X-ray imager of claim 22 wherein adjacent discrete electrodes are driven at different voltages to cause said counter charges to be driven to adjacent discrete electrodes with the highest potential.

24. The flat panel X-ray imager of claim 23 wherein said different voltages comprises signals from the signal group consisting of sawtooth, square and sinusoidal voltages and wherein each of said signals has a predetermined phase.

25. The flat panel X-ray imager of claim 24 wherein said plurality of discrete electrodes comprises a plurality of groupings of discrete electrodes wherein discrete electrodes in a respective group are driven with the same signal of the same predetermined phase and wherein no adjacent discrete electrode is in the same grouping.

26. The flat panel X-ray imager of claim 25 wherein each grouping of discrete electrodes comprises three discrete electrodes.

27. The flat panel X-ray imager of claim 26 wherein said groupings are energized by voltage signals from the signal group consisting of sawtooth, square or sinusoidal voltages and wherein the groupings voltage signals are 120° out of phase with each other.

28. The flat panel X-ray imager of claim 27 wherein each of said respective sawtooth waveforms comprises an amplitude of approximately 1.9 kV-2.1 kV where a high voltage bias of approximately 2 kV is used.

29. The flat panel X-ray imager of claim 22 wherein a pitch of each of said discrete electrodes is proportional to a thickness of said dielectric layer.

30. The flat panel X-ray imager of claim 29 wherein a thickness of each of said discrete electrodes may comprise half of said pitch or less.

31. A method of returning trapped counter charges in a flat panel X-ray imager comprising a continuous electrode, a dielectric layer, a photoconducting layer for converting X-ray energy to electron-hole pairs, a thin film transistor layer coupled between charge collection electrodes, disposed within said photoconducting layer, and a ground, said method comprising:
positioning a continuous electrode against a first side of said dielectric layer;
embedding a plurality of discrete electrodes within said dielectric layer which is in contact with said photoconducting layer on a second side, opposite of said first side, of said dielectric layer;
coupling a high voltage bias source between said continuous electrode, including said discrete electrodes, and ground for achieving X-ray capture and image readout which also causes trapped counter charges to appear at an interface between said second side of said dielectric layer;
energizing respective groupings of said discrete electrodes with respective energization signals to drive out said trapped counter charges towards gutter discrete electrodes positioned at edges of said interface which return said trapped counter charges to said high voltage bias source.

32. The method of claim 31 wherein said step of energizing respective groupings of discrete electrodes comprises moving said counter charges to adjacent discrete electrodes with the highest potential.

33. The method of claim 32 wherein said step of energizing respective groupings comprises applying respective drive voltage signals to said discrete electrodes such that no adjacent discrete electrode is energized with the same drive voltage signal.

34. The method of claim 33 wherein said drive voltage signals comprise a voltage signal from the signal group consisting of sawtooth, square and sinusoidal voltages and wherein each of said signals has a predetermined phase.

35. The method of claim 34 wherein each of said groupings comprises three discrete electrodes.

36. The method of claim 35 wherein said groupings are energized by voltage signals from the signal group consisting of sawtooth, square and sinusoidal voltages and wherein the groupings voltage signals are 120° out of phase with each other.

37. The method of claim 31 wherein said step of embedding a plurality of discrete electrodes comprises forming a pitch of each of said discrete electrodes that proportional to a thickness of said dielectric layer.

38. The method of claim 31 further comprising the step of applying a light against an upper layer of said imager to accelerate the movement of the trapped counter charges toward said gutter discrete electrodes.

* * * * *